(12) United States Patent
Chen et al.

(10) Patent No.: US 12,361,894 B2
(45) Date of Patent: Jul. 15, 2025

(54) SHIFT REGISTER, DRIVING METHOD, GATE DRIVE CIRCUIT AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Wenbo Chen, Beijing (CN); Ziyang Yu, Beijing (CN); Mengqi Wang, Beijing (CN); Tiaomei Zhang, Beijing (CN); Erjin Zhao, Beijing (CN); Quanyong Gu, Beijing (CN); Tianyi Cheng, Beijing (CN); Jianpeng Wu, Beijing (CN); Zhiliang Jiang, Beijing (CN); Ming Hu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/579,984

(22) PCT Filed: Dec. 20, 2022

(86) PCT No.: PCT/CN2022/140471
§ 371 (c)(1),
(2) Date: Jan. 17, 2024

(87) PCT Pub. No.: WO2024/130557
PCT Pub. Date: Jun. 27, 2024

(65) Prior Publication Data
US 2025/0095590 A1    Mar. 20, 2025

(51) Int. Cl.
  *G09G 3/3266* (2016.01)
  *G11C 19/28* (2006.01)

(52) U.S. Cl.
  CPC ......... *G09G 3/3266* (2013.01); *G11C 19/287* (2013.01); *G09G 2310/0286* (2013.01)

(58) Field of Classification Search
  CPC ......... G09G 3/3266; G09G 2310/0286; G11C 19/287
  See application file for complete search history.

(56) References Cited

U.S. PATENT DOCUMENTS

2001/0015666 A1* 8/2001 Noda ............... G11C 7/222
                                                                327/277
2019/0206504 A1* 7/2019 Tao ............... G09G 3/3266

* cited by examiner

*Primary Examiner* — Adam R. Giesy
(74) *Attorney, Agent, or Firm* — WHDA, LLP (57) ABSTRACT

A shift register includes a shift module configured for causing the cascade signal output end to output a cascade signal in response to a signal of the input signal end; an reverse output module configured for causing the reverse signal output end to output a signal reverse to the cascade signal output end in response to a signal of the cascade signal output end; a latch module configured for causing an output end of the latch module to output a control signal of the masking signal end in response to signals of the cascade signal output end and the reverse signal output end of a previous level; and a selection output module configured for providing a signal of the first power supply end or the second power supply end to the driving signal output end in response to a signal of the output end of the latch module.

17 Claims, 7 Drawing Sheets

FIG. 7 in a first refresh rate stage, providing, by a latch module, a control signal of the masking signal end to the selection output module according to the signals of the cascade signal output end and the reverse signal output end of the previous level; providing, by the selection output module, a signal of the first power supply end to the driving signal output end in response to the control signal of the masking signal end ⎯⎯ S801 in a second refresh rate stage, providing, by the latch module, a control signal of the masking signal end to the selection output module according to the signals of the cascade signal output end and the reverse signal output end of the previous level; and providing, by the selection output module, a signal of the second power supply end to the driving signal output end in response to the control signal of the masking signal end ⎯⎯ S802

FIG. 10

SHIFT REGISTER, DRIVING METHOD, GATE DRIVE CIRCUIT AND DISPLAY DEVICE

TECHNICAL FIELD

The present disclosure relates to the technical field of display and more particularly, to a shift register, a driving method, a gate drive circuit and a display device.

BACKGROUND

With the rapid development of display technology, display devices are increasingly developing towards high integration and low cost. Here, GOA (Gate Driver on Array) technology integrates a TFT (Thin Film Transistor) gate drive circuit on an array substrate of a display device to form scanning driving for the display device. Here, the gate drive circuit is generally composed of a plurality of cascaded shift registers.

SUMMARY

An embodiment of the present disclosure provides a shift register including:
- a shift module respectively coupled to an input signal end and a cascade signal output end, wherein the shift module is configured for causing the cascade signal output end to output a cascade signal in response to a signal of the input signal end;
- a reverse output module respectively coupled to the cascade signal output end, a first power supply end, a second power supply end and a reverse signal output end, wherein the reverse output module is configured for causing the reverse signal output end to output a signal reverse to the cascade signal output end in response to a signal of the cascade signal output end;
- a latch module respectively coupled to a masking signal end, the cascade signal output end and the reverse signal output end of the previous level, wherein the latch module is configured for causing an output end of the latch module to output a control signal of the masking signal end in response to signals of the cascade signal output end and the reverse signal output end of the previous level; and
- a selection output module respectively coupled to the first power supply end, the second power supply end, the output end of the latch module and a driving signal output end, wherein the selection output module is configured for providing a signal of the first power supply end or the second power supply end to the driving signal output end in response to a signal of the output end of the latch module.

Optionally, in an embodiment of the present disclosure, the reverse output module comprises a first switching transistor and a second switching transistor; the types of the first switching transistor and the second switching transistor are different;
wherein, a gate of the first switching transistor is coupled to the cascade signal output end, a first electrode of the first switching transistor is coupled to the first power supply end, and a second electrode of the first switching transistor is coupled to the reverse signal output end; and
a gate of the second switching transistor is coupled to the cascade signal output end, a first electrode of the second switching transistor is coupled to the second power supply end, and a second electrode of the second switching transistor is coupled to the reverse signal output end.

Optionally, in an embodiment of the present disclosure, the latch module comprises a third switching transistor and a fourth switching transistor;
wherein, a gate of the third switching transistor is coupled to the cascade signal output end, a first electrode of the third switching transistor is coupled to the masking signal end, and a second electrode of the third switching transistor is coupled to a first electrode of the fourth switching transistor; and
a gate of the fourth switching transistor is coupled to the reverse signal output end of the previous level, and a second electrode of the fourth switching transistor is the output end of the latch module.

Optionally, in an embodiment of the present disclosure, the selection output module comprises a fifth switching transistor, a sixth switching transistor and a first capacitor; the types of the fifth switching transistor and the sixth switching transistor are different;
wherein, a gate of the fifth switching transistor is coupled to the second electrode of the fourth switching transistor, and a first electrode of the fifth switching transistor is coupled to the driving signal output end;
a gate of the sixth switching transistor is coupled to the second electrode of the fourth switching transistor, a first electrode of the sixth switching transistor is coupled to the second power supply end, and a second electrode of the sixth switching transistor is coupled to the driving signal output end; and
a first end of the first capacitor is coupled to the first power supply end, and a second end of the first capacitor is coupled to the second electrode of the fourth switching transistor.

Optionally, in an embodiment of the present disclosure, a second electrode of the fifth switching transistor is coupled to the cascade signal output end.

Optionally, in an embodiment of the present disclosure, the selection output module further comprises a seventh switching transistor; the type of the seventh switching transistor is the same as the type of the fifth switching transistor; a gate of the seventh switching transistor is coupled to the shift module, a first electrode of the seventh switching transistor is coupled to the first power supply end, and a second electrode of the seventh switching transistor is coupled to a second electrode of the fifth switching transistor.

Optionally, in an embodiment of the present disclosure, further comprising an eighth switching transistor, wherein a gate of the eighth switching transistor is coupled to the shift module, a first electrode of the eighth switching transistor is coupled to the second power supply end, and a second electrode of the eighth switching transistor is coupled to the driving signal output end.

Optionally, in an embodiment of the present disclosure, the first switching transistor, the third switching transistor, the fourth switching transistor, the fifth switching transistor, and the eighth switching transistor are P-type transistors; and the second switching transistor and the sixth switching transistor are both N-type transistors.

Optionally, in an embodiment of the present disclosure, the shift module comprises:
an input circuit respectively coupled to the input signal end, a first clock signal end, the second power supply end, a first node and a second node, wherein the input circuit is configured for providing the signal of the input signal end to the first node and the second node in response to a signal of the first clock signal end;
a node control circuit respectively coupled to the first node, the second node, a third node, a fourth node, a fifth node, the first power supply end, the second power supply end, the first clock signal end and the second clock signal end, wherein the node control circuit is configured for adjusting signals at the first node, the second node, the third node, the fourth node and the fifth node, so that the cascade signal output end outputs the signal of the first power supply end or the signal of the second power supply end;
a reset circuit respectively coupled to the first power supply end, a reset signal end, the first node, the fourth node and the fifth node, wherein the reset circuit is configured for resetting a cascade signal output by the cascade signal output end in response to a signal of the reset signal end;
a first cascade output circuit respectively coupled to the fourth node, the first power supply end and the cascade signal output end, wherein the first cascade output circuit is configured for providing the signal of the first power supply end to the cascade signal output end in response to a signal of the fourth node; the gate of the seventh switching transistor is coupled to the fourth node; and
a second cascade output circuit respectively coupled to the fifth node, the second power supply end and the cascade signal output end, wherein the second cascade output circuit is configured for providing the signal of the second power supply end to the cascade signal output end in response to a signal of the fifth node; and the gate of the eighth switching transistor is coupled to the fifth node.

Optionally, in an embodiment of the present disclosure, the input circuit comprises a ninth switching transistor, a tenth switching transistor and an eleventh switching transistor;
a gate of the ninth switching transistor is coupled to the first clock signal end, a first electrode of the ninth switching transistor is coupled to the input signal end, and a second electrode of the ninth switching transistor is coupled to the first node;
a gate of the tenth switching transistor is coupled to the first clock signal end, a first electrode of the tenth switching transistor is coupled to the input signal end, and a second electrode of the tenth switching transistor is coupled to a first electrode of the eleventh switching transistor;
a gate of the eleventh switching transistor is coupled to the second power supply end, and a second electrode of the eleventh switching transistor is coupled to the second node.

Optionally, in an embodiment of the present disclosure, the node control circuit comprises a twelfth switching transistor, a thirteenth switching transistor, a fourteenth switching transistor, a fifteenth switching transistor, a sixteenth switching transistor, a seventeenth switching transistor, an eighteenth switching transistor, a nineteenth switching transistor, a second capacitor and a third capacitor;
wherein, a gate of the twelfth switching transistor is coupled to the first clock signal end, a first electrode of the twelfth switching transistor is coupled to the second power supply end, and a second electrode of the twelfth switching transistor is coupled to the third node;
a gate of the thirteenth switching transistor is coupled to the first node, a first electrode of the thirteenth switching transistor is coupled to the first clock signal end, and a second electrode of the thirteenth switching transistor is coupled to the third node;
a gate and a first electrode of the fourteenth switching transistor are both coupled to the second node, and a second electrode of the fourteenth switching transistor is coupled to the fifth node;
a gate of the fifteenth switching transistor is coupled to the second node, a first electrode of the fifteenth switching transistor is coupled to the second clock signal end, and a second electrode of the fifteenth switching transistor is coupled to a first electrode of the sixteenth switching transistor;
a gate of the sixteenth switching transistor is coupled to the third node, and a second electrode of the sixteenth switching transistor is coupled to the first power supply end;
a first end of the second capacitor is coupled to the second node, and a second end of the second capacitor is coupled to the first electrode of the sixteenth switching transistor;
a gate of the seventeenth switching transistor is coupled to the second power supply end, a first electrode of the seventeenth switching transistor is coupled to the third node, and a second electrode of the seventeenth switching transistor is coupled to a gate of the eighteenth switching transistor;
a first electrode of the eighteenth switching transistor is coupled to the second clock signal end, and a second electrode of the eighteenth switching transistor is coupled to a first electrode of the nineteenth switching transistor;
a gate of the nineteenth switching transistor is coupled to the second clock signal end, and a second electrode of the nineteenth switching transistor is coupled to the fourth node; and
a first end of the third capacitor is coupled to the gate of the eighteenth switching transistor, and a second end of the third capacitor is coupled to the second electrode of the eighteenth switching transistor.

Optionally, in an embodiment of the present disclosure, the reset circuit comprises a twentieth switching transistor, a twenty-first switching transistor and a twenty-second switching transistor;
wherein, a gate of the twentieth switching transistor is coupled to the reset signal end, a first electrode of the twentieth switching transistor is coupled to the first power supply end, and a second electrode of the twentieth switching transistor is coupled to the first node and a gate of the twenty-first switching transistor;
a first electrode of the twenty-first switching transistor is coupled to the first power supply end, and a second electrode of the twenty-first switching transistor is coupled to the fourth node; and
a gate of the twenty-second switching transistor is coupled to the second power supply end, a first electrode of the twenty-second switching transistor is coupled to the first node, and a second electrode of the twenty-second switching transistor is coupled to the fifth node.

Optionally, in an embodiment of the present disclosure, the first cascade output circuit comprises a twenty-third switching transistor and a fourth capacitor;
wherein, a gate of the twenty-third switching transistor is coupled to the fourth node, a first electrode of the twenty-third switching transistor is coupled to the first power supply end, a second electrode of the twenty-third switching transistor is coupled to the cascade signal output end; and a first end of the fourth capacitor is coupled to the fourth node, and a second end of the fourth capacitor is coupled to the first power supply end.

Optionally, in an embodiment of the present disclosure, the second cascade output circuit comprises a twenty-fourth switching transistor, a gate of the twenty-fourth switching transistor is coupled to the fifth node, a first electrode of the twenty-fourth switching transistor is coupled to the second power supply end, and a second electrode of the twenty-fourth switching transistor is coupled to the cascade signal output end.

An embodiment of the present disclosure provides a gate drive circuit, wherein the gate drive circuit comprises a plurality of cascaded shift registers described above;

an input signal end of a first-stage shift register is configured for being coupled to a frame trigger signal end; and in each adjacent two of the shift registers, an input signal end of a shift register of a next level is configured for being coupled to a cascade signal output end of a shift register of a previous level.

An embodiment of the present disclosure provides a display device, wherein the display device comprises the above gate drive circuit.

An embodiment of the present disclosure provides a method for driving the above shift register, wherein the method comprises:

in a first refresh rate stage, providing, by the latch module, a control signal of the masking signal end to the selection output module according to the signals of the cascade signal output end and the reverse signal output end of the previous level; and providing, by the selection output module, the signal of the first power supply end to the driving signal output end in response to the control signal of the masking signal end; and in a second refresh rate stage, providing, by the latch module, a control signal of the masking signal end to the selection output module according to the signals of the cascade signal output end and the reverse signal output end of the previous level; and providing, by the selection output module, the signal of the second power supply end to the driving signal output end in response to the control signal of the masking signal end.

DETAILED DESCRIPTION OF THE EMBODIMENTS

In order to make the purpose, technical solution, and advantages of the embodiment of the present disclosure clearer, the following will provide a clear and complete description of the technical solution of the embodiment of the present disclosure in conjunction with the accompanying drawings. Obviously, the described embodiments are a portion of the embodiment of the present disclosures, rather than the entire embodiments. And, without conflict, the embodiments and features in the embodiments of the present disclosure can be combined with each other. Based on the described embodiments of the present disclosure, all other embodiments obtained by persons skilled in the art without the need for creative labor fall within the scope of protection of the present disclosure.

Unless otherwise defined, technical or scientific terms used in the present disclosure shall have the usual meaning understood by individuals with persons skills in the art to which the present disclosure belongs. The terms "first", "second", and similar terms used in the present disclosure do not indicate any order, quantity, or importance, but are only used to distinguish different components. Words such as "comprising" or "including" refer to components or objects that appear before the word, including those listed after the word and their equivalents, without excluding other components or objects. Words like "connected to" or "connection" are not limited to physical or mechanical connections, but can include electrical connections, whether direct or indirect.

It should be noted that the dimensions and shapes of each figure in the attached drawings do not reflect the true scale, and are only intended to illustrate the content of the present disclosure. And the same or similar labels throughout represent the same or similar components or components with the same or similar functions.

Figure 1:
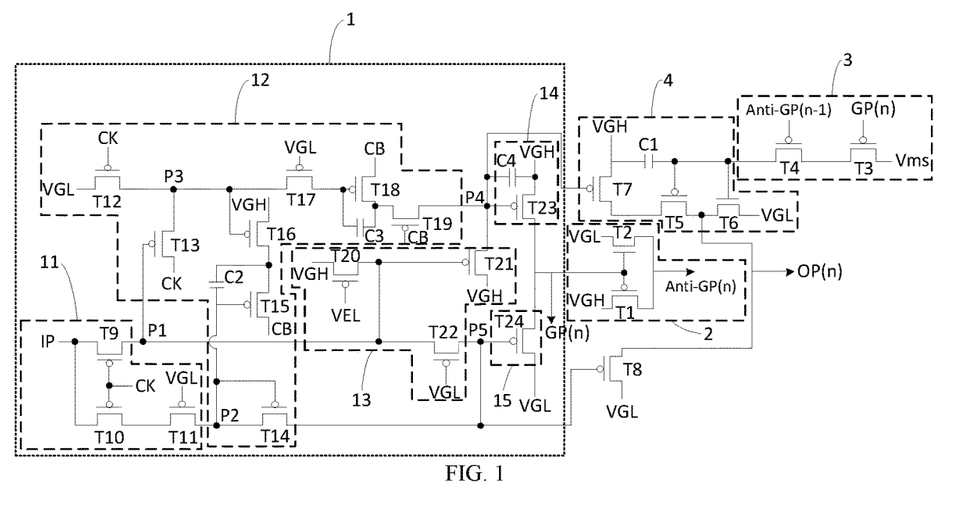
FIG. 1 is a schematic structural diagram of a shift register according to an embodiment of the present disclosure.
Figure 2:
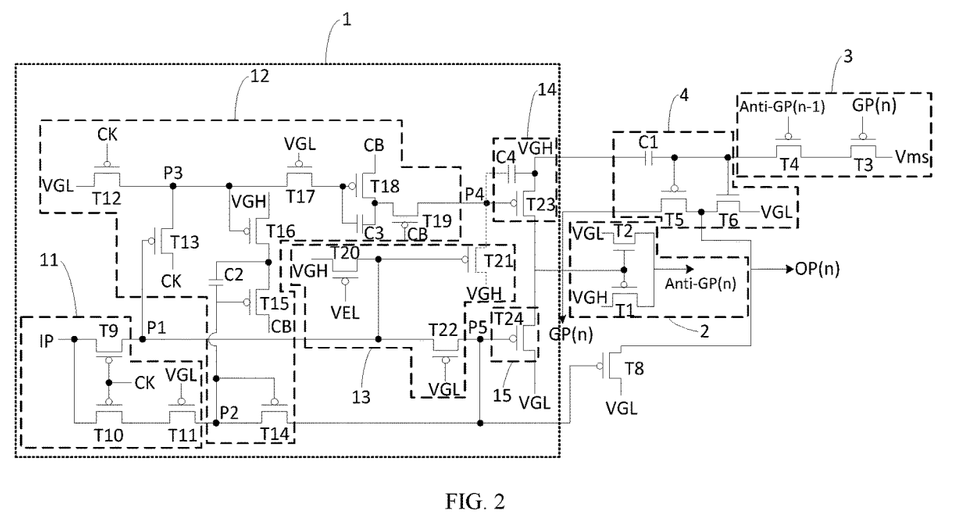
FIG. 2 is a schematic structural diagram of another shift register according to an embodiment of the present disclosure.

Embodiments of the present disclosure provide a shift register, as shown in FIGS. 1 and 2, which may include:

a shift module 1 respectively coupled to an input signal end IP and a cascade signal output end GP(n), wherein the shift module 1 is configured for causing the cascade signal output end GP(n) to output a cascade signal in response to the signal of the input signal end IP;

a reverse output module 2 respectively coupled to the cascade signal output end GP(n), a first power supply end VGH, a second power supply end VGL and a reverse signal output end Anti-GP(n), wherein the reverse output module 2 is configured for causing the reverse signal output end Anti-GP(n) to output a signal reverse to the cascade signal output end GP(n) in response to the signal of the cascade signal output end GP(n);

a latch module 3 respectively coupled to a masking signal end Vms, a cascade signal output end GP(n) and a reverse signal output end Anti-GP(n−1) of a previous level, wherein the latch module 3 is configured for causing an output end of the latch module 3 to output a signal of the masking signal end Vms in response to signals of the cascade signal output end GP(n) and the reverse signal output end Anti-GP(n−1) of the previous level; and a selection output module 4 respectively coupled to a first power supply end VGH, a second power supply end VGL, the output end of the latch module 3 and a driving signal output end OP(n), wherein the selection output module 4 is configured for supplying a signal of the first power supply end VGH or a signal of the second power supply end VGL to the driving signal output end OP(n) in response to a signal of the output end of the latch module 3.

The above-mentioned shift register provided in the embodiment of the present disclosure may realize the control of a signal output from a driving signal output end by adding an reverse output module, a latch module and a selection output module which are coupled to the shift module, and locking a control signal of a corresponding masking signal end into the selection output module according to the requirements of a refresh rate of an active area by the cooperation of the several modules, so that different refresh rates may be realized in different areas of a display panel, i.e., a coexistence of high and low refresh rates may be realized in the same frame of picture. Furthermore, the embodiments of the present disclosure are not limited to realizing different refresh rates in a fixed area of a display panel, and may realize dynamic refresh in any area, so that the power consumption of the display panel may be reduced. Meanwhile, the latch module may store the control signal of the masking signal end into each stage of the shift register by using the phase difference of the cascade signals output by the previous and next stages of the shift module, so as to realize the continuous and correct output of the stage of the shift register. In addition, only one control line electrically connected to the masking signal end is needed to control the whole screen adaptive refresh rate, which not only reduces the difficulty of LayOP wiring and the width of the frame, but also further reduces the multiple control lines used for realizing multi-frequency driving, resulting in the need to additionally increase the control power consumption of the driving chip.

The specific structure of the shift module 1 provided by the embodiment of the present disclosure is described below.

In a possible implementation, in the shift register described above provided by an embodiment of the present disclosure, as shown in FIGS. 1 and 2, the shift module 1 may include:

an input circuit 11 respectively coupled to an input signal end IP, a first clock signal end CK, a second power supply end VGL, a first node P1 and a second node P2, wherein the input circuit 11 is configured for providing the signal of the input signal end IP to the first node P1 and the second node P2 in response to the signal of the first clock signal end CK. For example, the input circuit 11 may include a ninth switching transistor T9, a tenth switching transistor T10 and an eleventh switching transistor T11; the gate of the ninth switching transistor T9 is coupled to the first clock signal end CK, a first electrode of the ninth switching transistor T9 is coupled to the input signal end IP, and a second electrode of the ninth switching transistor T9 is coupled to the first node P1; the gate of the tenth switching transistor T10 is coupled to the first clock signal end CK, a first electrode of the tenth switching transistor T10 is coupled to the input signal end IP, and a second electrode of the tenth switching transistor T10 is coupled to a first electrode of the eleventh switching transistor T11; the gate of the eleventh switching transistor T11 is coupled to the second power supply end VGL, and a second electrode of the eleventh switching transistor T11 is coupled to the second node P2;

a node control circuit 12 respectively coupled to the first node P1, the second node P2, a third node P3, a fourth node P4, a fifth node P5, a first power supply end VGH, a second power supply end VGL, a first clock signal end CK and a second clock signal end CB, wherein the node control circuit 12 is configured for adjusting signals of the first node P1, the second node P2, the third node P3, the fourth node P4 and the fifth node P5, so that the cascade signal output end GP(n) outputs a signal of the first power supply end VGH or a signal of the second power supply end VGL. For example, the node control circuit 12 may include a twelfth switching transistor T12, a thirteenth switching transistor T13, a fourteenth switching transistor T14, a fifteenth switching transistor T15, a sixteenth switching transistor T16, a seventeenth switching transistor T17, an eighteenth switching transistor T18, a nineteenth switching transistor T19, a second capacitor C2 and a third capacitor C3;

wherein, a gate of the twelfth switching transistor T12 is coupled to the first clock signal end CK, a first electrode of the twelfth switching transistor T12 is coupled to the second power supply end VGL, and a second electrode of the twelfth switching transistor T12 is coupled to the third node P3;

a gate of the thirteenth switching transistor T13 is coupled to the first node P1, a first electrode of the thirteenth switching transistor T13 is coupled to the first clock signal end CK, and a second electrode of the thirteenth switching transistor T13 is coupled to the third node P3;

a gate and a first electrode of the fourteenth switching transistor T14 are both coupled to the second node P2, and a second electrode of the fourteenth switching transistor T14 is coupled to the fifth node P5;

a gate of the fifteenth switching transistor T15 is coupled to the second node P2, a first electrode of the fifteenth switching transistor T15 is coupled to the second clock signal end CB, and a second electrode of the fifteenth switching transistor T15 is coupled to the first electrode of the sixteenth switching transistor T16;

a gate of the sixteenth switching transistor T16 is coupled to the third node P3, and a second electrode of the sixteenth switching transistor T16 is coupled to the first power supply end VGH;

a first end of the second capacitor C2 is coupled to the second node P2, and a second end of the second capacitor C2 is coupled to a first electrode of the sixteenth switching transistor T16;

a gate of the seventeenth switching transistor T17 is coupled to the second power supply end VGL, a first electrode of the seventeenth switching transistor T17 is coupled to the third node P3, and a second electrode of the seventeenth switching transistor T17 is coupled to a gate of the eighteenth switching transistor T18;

a first electrode of the eighteenth switching transistor T18 is coupled to the second clock signal end CB, and a second electrode of the eighteenth switching transistor T18 is coupled to the first electrode of the nineteenth switching transistor T19;

a gate of the nineteenth switching transistor T19 is coupled to the second clock signal end CB, and a second electrode of the nineteenth switching transistor T19 is coupled to the fourth node P4;

a first end of the third capacitor C3 is coupled to a gate of the eighteenth switching transistor T18, and a second end of the third capacitor C3 is coupled to a second electrode of the eighteenth switching transistor T18;

a reset circuit 13 respectively coupled to the first power supply end VGH, a reset signal end VEL, the first node P1, the fourth node P4 and the fifth node P5, wherein the reset circuit 13 is configured for resetting the cascade signal output by the cascade signal output end GP(n) in response to the signal of the reset signal end VEL. Specifically, the reset circuit 13 is configured for resetting the voltages of the fourth node P4 and the fifth node P5 in response to the signal of the reset signal end VEL, so that the cascade signal output by the cascade signal output end GP(n) may be reset. For example, the reset circuit 13 may include a twentieth switching transistor T20, a twenty-first switching transistor T21 and a twenty-second switching transistor T22;

wherein, the gate of the twentieth switching transistor T20 is coupled to the reset signal end VEL, a first electrode of the twentieth switching transistor T20 is coupled to the first power supply end VGH, and a second electrode of the twentieth switching transistor T20 is coupled to the first node P1 and a gate of the twenty-first switching transistor T21;

a first electrode of the twenty-first switching transistor T21 is coupled to the first power supply end VGH, and a second electrode of the twenty-first switching transistor T21 is coupled to the fourth node P4;

a gate of the twenty-second switching transistor T22 is coupled to the second power supply end VGL, a first electrode of the twenty-second switching transistor T22 is coupled to the first node P1, and a second electrode of the twenty-second switching transistor T22 is coupled to the fifth node P5;

a first cascade output circuit 1 respectively coupled to the fourth node P4, the first power supply end VGH and the cascade signal output end GP(n), wherein the first cascade output circuit 14 is configured for providing the signal of the first power supply end VGH to the cascade signal output end GP(n) in response to the signal of the fourth node P4. For example, the first cascade output circuit 14 may include a twenty-third switching transistor T23 and a fourth capacitor C4; wherein, a gate of the twenty-third switching transistor T23 is coupled to the fourth node P4, a first electrode of the twenty-third switching transistor T23 is coupled to the first power supply end VGH, and a second electrode of the twenty-third switching transistor T23 is coupled to the cascade signal output end GP(n);

a first end of the fourth capacitor C4 is coupled to the fourth node P4, and a second end of the fourth capacitor C4 is coupled to the first power supply end VGH;

a second cascade output circuit 15 respectively coupled to the fifth node P5, the second power supply end VGL and the cascade signal output end GP(n), wherein the second cascade output circuit 15 is configured for providing the signal of the second power supply end VGL to the cascade signal output end GP(n) in response to the signal of the fifth node P5. For example, the second cascade output circuit 15 may include a twenty-fourth switching transistor T24, wherein a gate of the twenty-fourth switching transistor T24 is coupled to the fifth node P5, a first electrode of the twenty-fourth switching transistor T24 is coupled to the second power supply end VGL, and a second electrode of the twenty-fourth switching transistor T24 is coupled to the cascade signal output end GP(n).

In order to simplify the manufacturing process, in a specific implementation, all the switching transistors of the shift module 1 may be P-type transistors as shown in FIGS. 1 and 2 in the embodiments of the present disclosure.

The above is merely an embodiment of a specific structure of the shift module in the shift register provided by an embodiment of the present disclosure. In a specific implementation, the specific structure of each circuit described above is not limited to the above-mentioned structure provided by the embodiment of the present disclosure, may be other structures known to those skilled in the art, and is not limited thereto.

It should be noted that the embodiment of the present disclosure provides the operation principle of the shift module 1 shown in the above-mentioned FIGS. 1 and 2, which is the same as that in the related art, and mainly generates a cascade signal via the cascade signal output end GP(n) so as to realize a signal shift function, which is not described in detail herein.

It should be noted that the main function of the shift module 1 provided in the embodiment of the present disclosure is the implementation of a timing shift function from top to bottom. The shift module 1 using 16T3C which transmits signals more stably is selected by the embodiment of the present disclosure. Certainly, the shift module 1 may not be limited to the 16T3C structure provided in the embodiment of the present disclosure, and may be other various shift registers which may implement the shift function, such as 10T3C, 12T3C, 13T3C and so on commonly used in an OLED display panel. Alternatively, as shown in FIG. 3, it is a schematic structural view of another shift module 1 provided by an embodiment of the present disclosure, the function of which is the same as that of the shift module 1 in FIGS. 1 and 2, will not be described in detail.

Figure 3:
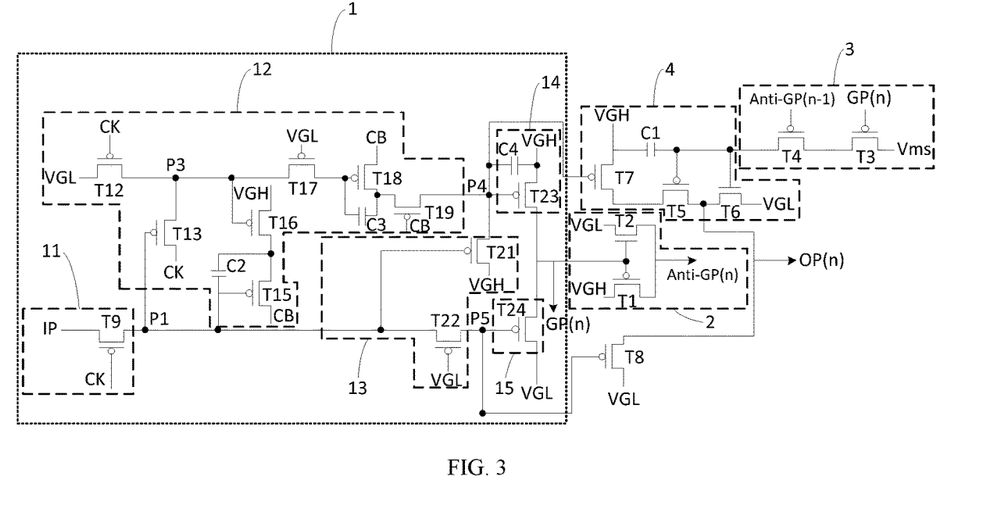
FIG. 3 is a schematic structural diagram of yet another shift register according to an embodiment of the present disclosure.

In a specific implementation, in the shift register described above provided by the embodiments of the present disclosure, as shown in FIGS. 1-3, the reverse output module 2 may include a first switching transistor T1 and a second switching transistor T2. The types of the first switching transistor T1 and the second switching transistor T2 are different. For example, the first switching transistor T1 is a P-type transistor, and the second switching transistor T2 is an N-type transistor;

wherein, a gate of the first switching transistor T1 is coupled to the cascade signal output end GP(n), a first electrode of the first switching transistor T1 is coupled to the first power supply end VGH, and a second electrode of the first switching transistor T1 is coupled to the reverse signal output end Anti-GP(n); and a gate of the second switching transistor T2 is coupled to the cascade signal output end GP(n), a first electrode of the second switching transistor T2 is coupled to the second power supply end VGL, and a second electrode of the second switching transistor T2 is coupled to the reverse signal output end Anti-GP(n).

Specifically, as shown in FIGS. 1-3, the reverse output module 2 uses a circuit structure of an N-type transistor and a P-type transistor to construct a reverse signal of GP(n−1), so as to realize that the latch module writes a control signal of a required masking signal end in advance by using a phase difference of cascade signals output by the shift module at the previous level and the next stage. Thus, one control signal may control the output of multiple effective level signals (high levels).

In a specific implementation, in the shift register described above provided by embodiments of the present disclosure, as shown in FIGS. 1-3, the latch module 3 may include a third switching transistor T3 and a fourth switching transistor T4;

wherein, a gate of the third switching transistor T3 is coupled to the cascade signal output end GP(n), a first electrode of the third switching transistor T3 is coupled to the masking signal end Vms, and a second electrode of the third switching transistor T3 is coupled to a first electrode of the fourth switching transistor T4; and a gate of the fourth switching transistor T4 is coupled to the reverse signal output end Anti-GP(n−1) of the previous level, and a second electrode of the fourth switching transistor T4 is the output end of the latch module 3.

Optionally, the latch module 3 may include a third switching transistor T3 and a fourth switching transistor T4;

wherein, a gate of the fourth switching transistor T4 is coupled to the cascade signal output end GP(n), a first electrode of the fourth switching transistor T4 is coupled to the masking signal end Vms, and a second electrode of the fourth switching transistor T4 is coupled to a first electrode of the third switching transistor T3; and the gate of the third switching transistor T3 is coupled to the reverse signal output end Anti-GP(n−1) of the previous level, and the second electrode of the third switching transistor T3 is an output end of the latch module 3.

Specifically, as shown in FIGS. 1-3, the latch module 3 uses the phase difference between the signal of the reverse signal output end Anti-GP(n−1) of the previous level and the signal of the cascade signal output end GP(n) to realize that the control signal of the masking signal end Vms is written in advance and stored in the selection output module 4, so as to realize that the signal of the first power supply end VGH may be consistent with the signal of GP(n) to cause the long-time output of multiple effective level signals (high levels).

In a specific implementation, in the shift register described above provided by the embodiments of the present disclosure, as shown in FIGS. 1-3, the selection output module 4 may include a fifth switching transistor T5, a sixth switching transistor T6 and a first capacitor C1; the types of the fifth switching transistor T5 and the sixth switching transistor T6 are different; for example, the fifth switching transistor T5 is a P-type transistor, and the sixth switching transistor T6 is an N-type transistor;

wherein, a gate of the fifth switching transistor T5 is coupled to the second electrode of the fourth switching transistor T4, and a first electrode of the fifth switching transistor T5 is coupled to the driving signal output end OP(n);

a gate of the sixth switching transistor T6 is coupled to the second electrode of the fourth switching transistor T4, a first electrode of the sixth switching transistor T6 is coupled to the second power supply end VGL, and a second electrode of the sixth switching transistor T6 is coupled to the driving signal output end OP(n); and a first end of the first capacitor C1 is coupled to the first power supply end VGH, and a second electrode of the first capacitor C1 is coupled to a second electrode of the fourth switching transistor T4.

Specifically, the selection output module 4 changes a high-level signal output from the driving signal output end OP(n) into a low-level signal by storing the high-level signal or the low-level signal written by the masking signal end Vms, or maintains the high-level signal output normally, so as to achieve the requirements of different refresh rates in the active area.

In a specific implementation, in the shift register described above provided by the embodiment of the present disclosure, as shown in FIGS. 1 and 3, the selection output module 4 may further include a seventh switching transistor T7. The type of the seventh switching transistor T7 is the same as the type of the fifth switching transistor T5. For example, the seventh switching transistor T7 is a P-type transistor. The gate of the seventh switching transistor T7 is coupled to the shift module 1 (the fourth node P4). The first electrode of the seventh switching transistor T7 is coupled to the first power supply end VGH, and the second electrode of the seventh switching transistor T7 is coupled to the second electrode of the fifth switching transistor T5.

Specifically, as shown in FIGS. 1 and 3, when the signal of the fourth node P4 is a low-level signal, the control signal of the masking signal end Vms may be controlled to be a high-level or a low-level according to the requirements of the display refresh rate, so that the driving signal output end OP(n) outputs a low-level or a high-level. Thus, different refresh rates may be realized in different areas of the display panel.

In a specific implementation, in the shift register described above provided by the embodiments of the present disclosure, the second electrode of the fifth switching transistor T5 may be directly coupled to the cascade signal output end GP(n) as shown in FIG. 2. Specifically, the structure of the selection output module 4 shown in FIG. 2 reduces a seventh switching transistor T7 common-gate to the twenty-third switching transistor T23 compared with the structure of the selection output module 4 shown in FIG. 1, because the fifth switching transistor T5 may lock the voltage of the cascade signal output end GP(n), and directly output the high-level signal output by the cascade signal output end GP(n) to the driving signal output end OP(n), which may reduce one seventh switching transistor T7 (Buffer tube), and save LayOP wiring space.

In a specific implementation, in the above-mentioned shift register provided by the embodiments of the present disclosure, as shown in FIGS. 1-3, an eighth switching transistor T8 is further included. The gate of the eighth switching transistor T8 is coupled to the shift module (fifth node P5). The first electrode of the eighth switching transistor T8 is coupled to the second power supply end VGL. The second electrode of the eighth switching transistor T8 is coupled to the driving signal output end OP(n).

Specifically, the main function of the eighth switching transistor T8 is to distinguish the signal of the second power supply end VGL output to the driving signal output end OP(n) from the normal cascade signal of the cascade signal output end GP(n), to avoid signal disturbance caused by the signal difference between the signal of the driving signal output end OP(n) and the signal of the cascade signal output end GP(n) when the control signal is written by the masking signal end Vms, so as to realize the normal shift function of the shift register.

In a specific implementation, in the above-mentioned shift register provided by the embodiments of the present disclosure, as shown in FIGS. 1-3, the first switching transistor T1, the third switching transistor T3, the fourth switching transistor T4, the fifth switching transistor T5 and the eighth switching transistor T8 are all P-type transistors, and the second switching transistor T2 and the sixth switching transistor T6 are all N-type transistors.

Further, in an embodiment, the P-type transistor is turned off by a high-level signal and conductive by a low-level signal. The N-type transistor is conductive by the high-level signal and turned off by the low-level signal.

In the specific implementation, as shown in FIGS. 1-3, when the control signal of the masking signal end Vms is the low-level signal, it may be −20 V-5 V. When it is the high-level signal, it may be 5 V-20 V.

In a specific implementation, as shown in FIGS. 1-3, the signal of the first power supply end VGH is the high-level signal, which may be, for example, 5 V-10 V. The signal of the second power supply end VGL is the low-level signal, and may be, for example, −10 V-5 V.

In a specific implementation, as shown in FIGS. 1-3, the signal of the first clock signal end CK and the signal of the second clock signal end CB are alternating current signals having the same period and reverse potentials.

In a specific implementation, according to a flow direction of a signal, the first electrode of each of the above-mentioned switching transistors may serve as a source electrode thereof, and the second electrode may serve as a drain electrode thereof. Alternatively, the first electrode serves as its drain electrode and the second electrode serves as its source electrode, and no specific distinction is made here.

It should be noted that the switching transistor mentioned in the above-mentioned embodiments of the present disclosure may be a TFT or a metal oxide semiconductor field effect transistor (Metal Oxide Semiconductor, MOS), and is not limited thereto.

Figure 4:
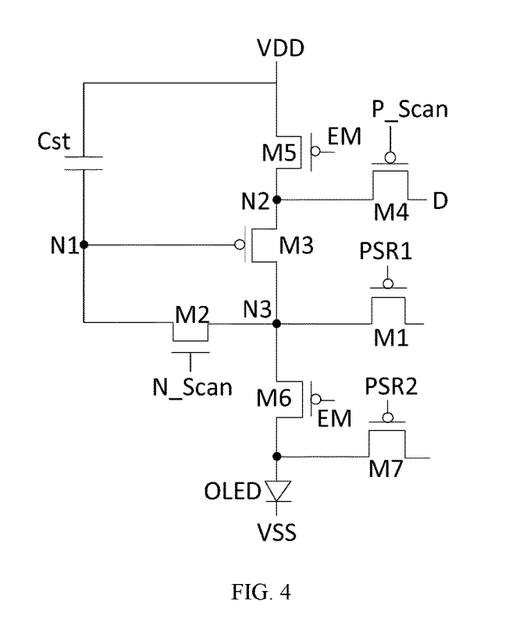
FIG. 4 is a schematic structural diagram of a pixel circuit according to an embodiment of the present disclosure.

Optionally, the above-mentioned shift register provided by an embodiment of the present disclosure may be used to provide a driving signal to an organic light emitting display panel. An active area of the organic light emitting display panel includes a plurality of sub-pixels, and each sub-pixel is generally provided with a plurality of organic light emitting diodes and a pixel circuit connected to each organic light emitting diode. The pixel circuit may have a structure, such as 6T1C, 7T1C, etc. as shown in FIG. 4. FIG. 4 shows a 7T1C pixel circuit structure provided by the embodiment of the present disclosure. The driving signal output by the driving signal output end OP(n) of the shift register shown in FIGS. 1-3 is mainly used for controlling an oxide switching transistor in a row of pixel circuits in the display panel (for providing a scanning signal to the gate of the first scanning transistor M2 in FIG. 4). When a frame is required to be refreshed, the driving signal output end OP(n) outputs a high level within a period of time, and outputs a low level in the remaining time period within one frame time, to control the first scanning transistor M2 to conduct so as to realize the refresh of the data voltage. In the non-refresh frame, the driving signal output end OP(n) always outputs a low level, and the first scanning transistor M2 cannot be conductive, thereby achieving non-refresh of the data voltage.

The pixel circuit provided by the embodiment of the present disclosure is not limited to the structure shown in FIG. 4, as long as the pixel circuit which requires the initialized transistor M1 and the scanning transistor M2 to be conductive at the same time to provide an initialization signal to the N1 node is a pixel circuit structure protected by the embodiment of the present disclosure.

Figure 5:
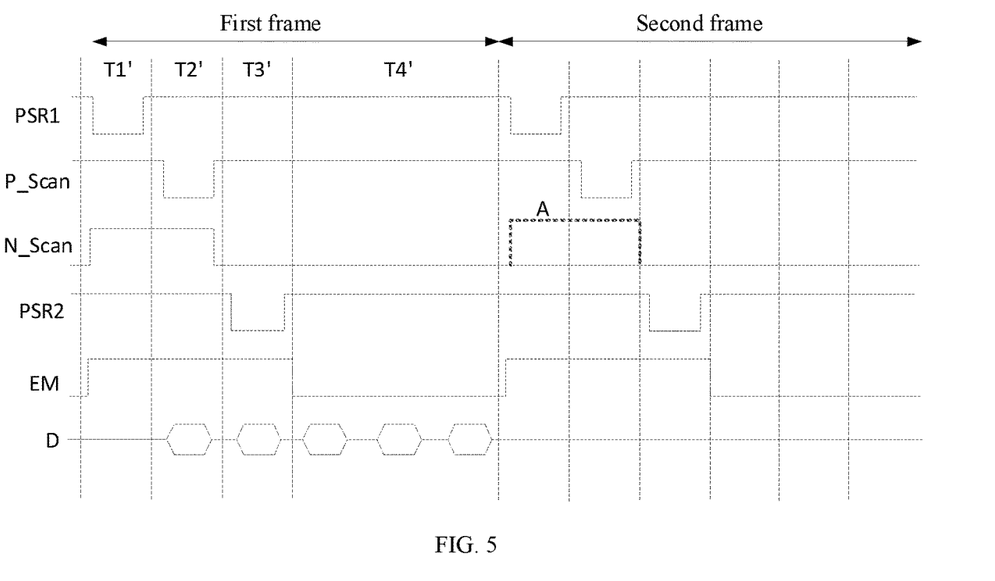
FIG. 5 is a signal timing diagram corresponding to the operation of the pixel circuit shown in FIG. 4.

The operation of the pixel circuit shown in FIG. 4 will be described with reference to the signal timing diagram shown in FIG. 5. Specifically, four stages of a first initialization stage T1', a data writing stage T2', a second initialization stage T3', and a light emitting stage T4' of one frame period in the signal timing diagram shown in FIG. 5 are selected.

In the first initialization phase T1', when a low-level signal is input to a first control end PSR1, a first initialization transistor M1 is conductive. A first initialization signal end Vint1 provides an initialization signal to an N3 node to initialize the N3 node.

In the data writing stage T2', when a low-level signal is input to a first scanning control end P_Scan, and a high-level signal is input to the second scanning control end N_Scan, the first scanning transistor M2 and the second scanning transistor M4 are both conductive. The driving transistor M3 maintains the conductive state in the light emitting stage of the previous frame. Thus, the data voltage of the data signal end D is written into the N1 node.

In the second initialization stage T3', when a low-level signal is input to the second control end PSR2, the second initialization transistor M7 is conductive. The second initialization signal end Vint2 provides an initialization signal to the anode of the OLED to initialize the anode.

In the light-emitting stage T4', when a low-level signal is input to the light-emitting control end EM, the first light-emitting control transistors M5 and M6 are both conductive. The signal of the first power supply end VDD generates a current through the driving transistor M3 to drive the OLED to emit light.

For example, the operation timing of the above-mentioned pixel circuit is a first frame. If the refresh rate of the first frame needs to be maintained in the second frame (namely, the second frame does not need to be refreshed), the first scanning transistor M2 needs to be controlled to be turned off in the data writing stage T2', and thus a low-level signal needs to be input to the driving signal output end OP(n) of the shift register provided by the embodiment of the present disclosure. That is, a high-level signal (dotted line A) which is originally input to the second scanning control end N_Scan in FIG. 5 is required to be changed as a low-level signal, so as to realize that the second frame is a refresh rate maintenance frame for the first frame. Embodiments of the present disclosure, however, provide that the shift registers shown in FIGS. 1-3 may achieve different refresh rates in different areas of a display panel.

The operation principle of the shift register capable of controlling the display panel to achieve different refresh rates in different areas provided by the embodiment of the present disclosure will be described below by taking the shift register shown in FIG. 1 as an example, in conjunction with the signal timing diagram shown in FIG. 6.

Figure 6:
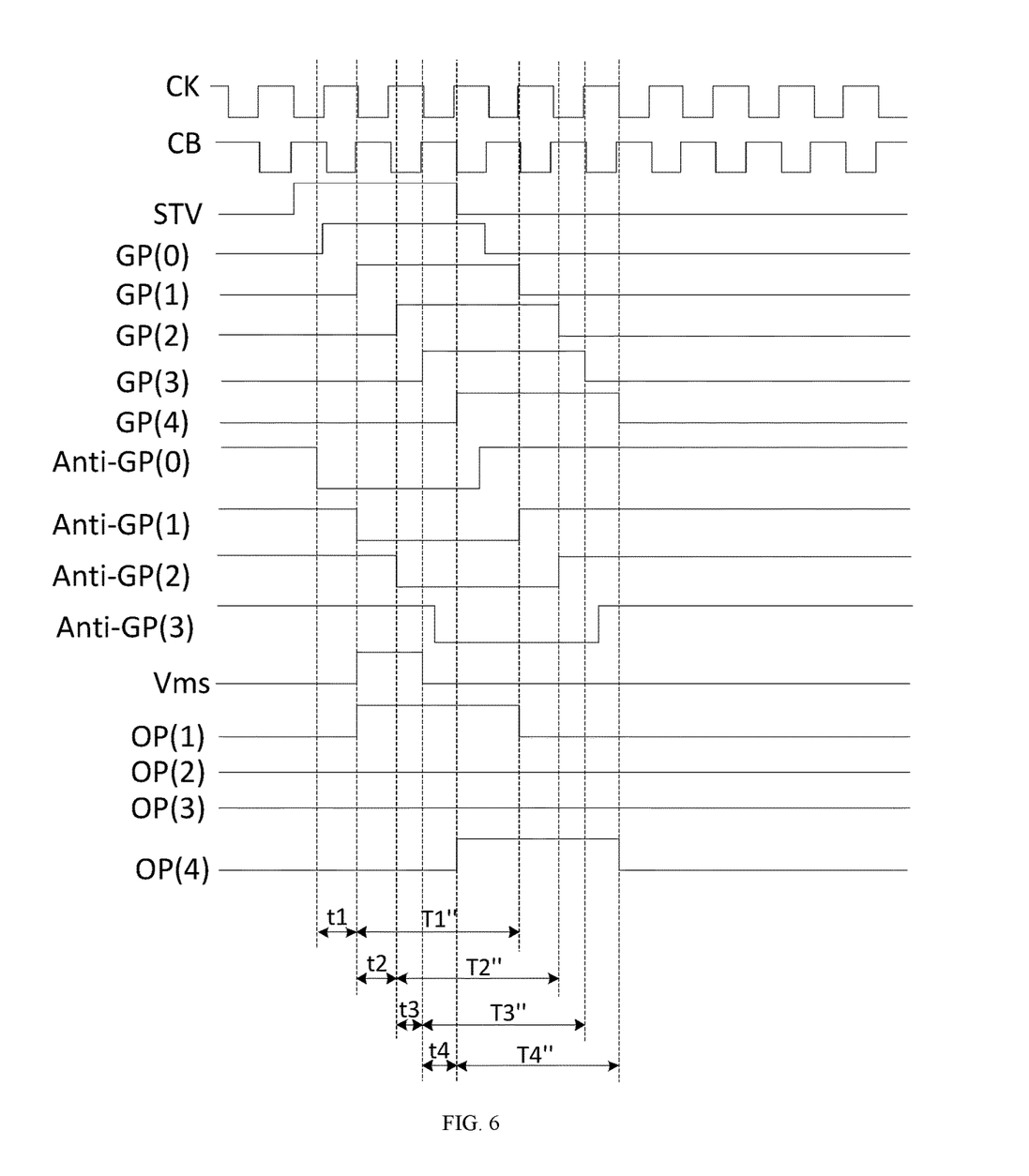
FIG. 6 is a signal timing diagram for the operation of a shift register according to an embodiment of the present disclosure.

Specifically, the signal timing diagram shown in FIG. 6 is only exemplified by the inputs (IP) and outputs (OP(1), OP(2), OP(3), OP(4)) of the previous four-stage shift register. For example, when an area corresponding to a second row of pixels and a third row of pixels in the display panel is a low refresh rate area, and an area corresponding to a first row of pixels and a fourth row of pixels are a high-refresh rate area, a third switching transistor T3 and a fourth switching transistor T4 are both conductive when a signal of a cascade signal output end GP(1) of a first-stage shift register and a signal of a reverse signal output end Anti-GP (0) of the previous level are both low-level signals (at time t1). That is, at time t1, the low-level signal of the masking signal end Vms is locked into a first capacitor C1 of the selection output module 4. When the first-level cascade signal output end GP(1) outputs a high level (time T1"), the signal of the fourth node P4 is a low-level signal, and the signal of the fifth node P5 is a high-level signal, the seventh switching transistor T7 is conductive. Since the first capacitor C1 maintains the low-level signal of the masking signal end Vms at time T1, then the fifth switching transistor T5 is conductive, and the sixth switching transistor T6 is turned off. Thus, at time T1", the driving signal output end OP(1) of the first-stage shift register outputs the high-level signal of the first power supply end VGH, realizing a high refresh rate of a first row of pixels in the active area. Certainly, the maintenance time for the driving signal output end OP(1) of the first-stage shift register to output the high-level signal of the first power supply end VGH may be set as required. For example, the maintenance time for the driving signal output end OP(1) of the first-stage shift register to output the high-level signal of the first power supply end VGH overlaps with the maintenance time for the driving signal output end OP(4) of the fourth-stage shift register to output the high-level signal of the first power supply end VGH. The pixel circuit corresponding to the driving signal output end OP(4) of the fourth-stage shift register may be pre-charged. Similarly, the maintenance time of the output level signal of the driving signal output end OP(n) of the shift register of the other stage is similar and will not be described again.

When the signal of the cascade signal output end GP(2) of the second-stage shift register and the signal of the reverse signal output end Anti-GP(1) of the previous level are both low-level signals (at time t2), the third switching transistor T3 and the fourth switching transistor T4 are both conductive, namely, at time t2, the high-level signal of the masking signal end Vms is locked in the first capacitor C1 of the selection output module 4. When the second stage cascade signal output end GP(2) outputs a high level (time T2"), the signal of the fourth node P4 is a low-level signal, and the signal of the fifth node P5 is a high-level signal. Thus, the seventh switching transistor T7 is conductive. Since the first capacitor C1 maintains the high-level signal of the masking signal end Vms at time t1, the fifth switching transistor T5 is turned off, and the sixth switching transistor T6 is conductive. At time T2", the driving signal output end OP(2) of the second stage shift register outputs the low-level signal of the second power supply end VGL, achieving a low refresh rate of a second row of pixels in the active area.

When the signal of the cascade signal output end GP(3) of the third-stage shift register and the signal of the reverse signal output end Anti-GP(2) of the previous level are both low-level signals (time T3), the third switching transistor T3 and the fourth switching transistor T4 are both conductive, namely, at time T3, the high-level signal of the masking signal end Vms is locked in the first capacitor C1 of the selection output module 4. When the third-stage cascade signal output end GP(3) outputs a high level (time T3'), the signal of the fourth node P4 is a low-level signal, and the signal of the fifth node P5 is a high-level signal. Thus, the seventh switching transistor T7 is conductive. Since the first capacitor C1 maintains the high-level signal of the masking signal end Vms at time t1, the fifth switching transistor T5 is turned off, and the sixth switching transistor T6 is conductive. Thus, at time T3", the driving signal output end OP(3) of the third-stage shift register outputs the low-level signal of the second power supply end VGL, realizing a low refresh rate of a third row of pixels in the active area.

When the signal of the cascade signal output end GP(4) of the fourth-stage shift register and the signal of the reverse signal output end Anti-GP(3) of the previous level are both low-level signals (at time T4), the third switching transistor T3 and the fourth switching transistor T4 are both conductive, namely, the low-level signal of the masking signal end Vms is locked in the first capacitor C1 of the selection output module 4 at time T4. When the fourth-stage cascade signal output end GP(4) outputs a high-level signal (at time T4"), the signal of the fourth node P4 is a low-level signal, and the signal of the fifth node P5 is a high-level signal, the seventh switching transistor T7 is conductive. Since the first capacitor C1 maintains the low-level signal of the masking signal end Vms at time t1, the fifth switching transistor T5 is conductive, and the sixth switching transistor T6 is turned off. At time T4", the driving signal output end OP(4) of the fourth-stage shift register outputs the high-level signal of the first power supply end VGH, so as to realize a high refresh rate of a fourth row of pixels in the active area.

Therefore, when a low refresh rate is required in a certain area of the display panel, a high-level signal is input by the masking signal end Vms, and the driving signal output end always outputs a low level. The oxide switching transistor (M2 in FIG. 3) corresponding to the pixel circuit in the display panel is turned off, the data voltage in the display panel is not charged, and the state of the previous frame is maintained, thereby achieving the low refresh rate in the area.

Optionally, the oxide switching transistors of the pixel circuits of different rows in the same frame may be selectively turned on or off according to the duration for which the high-level signal is given to the masking signal end Vms (for example, the operating time of 2-3 rows of the pixel circuits), and in combination with the signals of the cascade signal output end and the reverse signal output end of the previous level, thereby achieving the refresh rate of different rows of the display panel.

Figure 7:
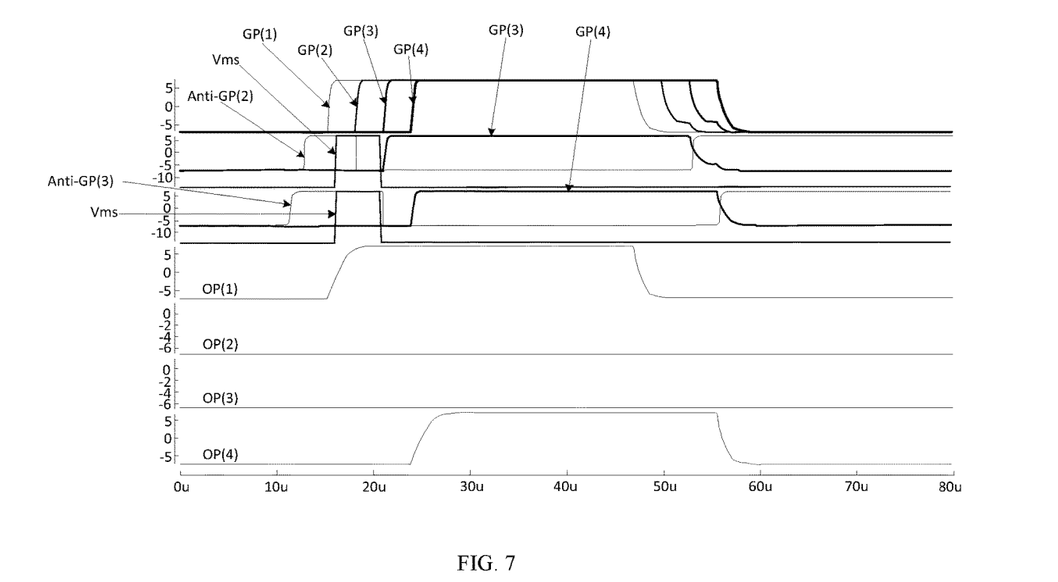
FIG. 7 is a simulation diagram corresponding to a driving signal output end of the shift register shown in FIG. 6.

The signal output from the drive signal output OP(n) of the shift register shown in FIG. 1 is also simulated according to the signal timing diagram shown in FIG. 6, and the simulation diagram is shown in FIG. 7. The abscissa represents time and the ordinate represents voltage. It can be seen that the embodiments of the present disclosure may control the signal output by the driving signal output end OP(n), and may realize different refresh rates in different areas of the display panel. That is, it may achieve the coexistence of high and low refresh rates in the same frame of picture. The embodiments of the present disclosure are not limited to realizing different refresh rates in fixed areas of the display panel, and may realize dynamic refresh in any area, so that the power consumption of the display panel may be reduced.

It should be noted that the embodiment of the present disclosure merely illustrates the operation of the shift register by taking the area corresponding to the second row of pixels and the third row of pixels in the display panel as the low refresh rate area as an example. Certainly, the low refresh rate may be implemented for any area in the display panel.

It should be noted that, in practical applications, the specific voltage values of the above-mentioned signals may be designed and determined according to the practical application environment, and are not limited herein.

Figure 8:
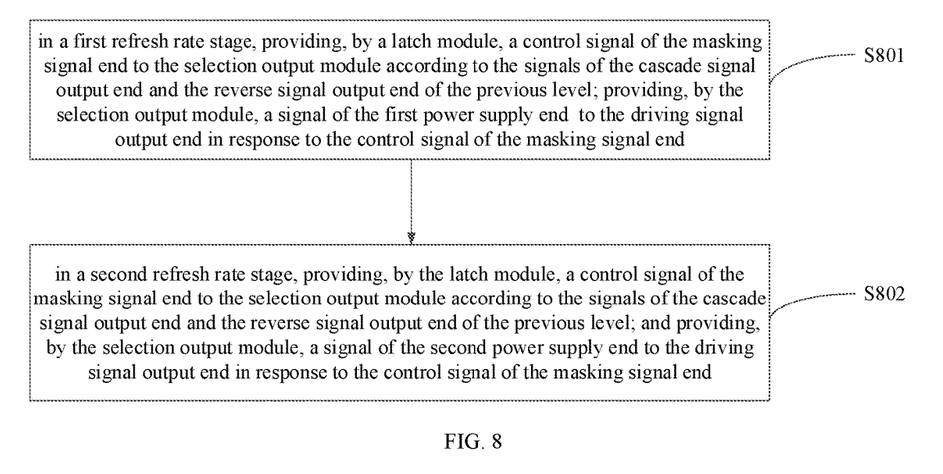
FIG. 8 is a flow chart of a driving method according to an embodiment of the present disclosure.

Based on the same inventive concept, embodiments of the present disclosure also provide a method for driving the shift register described above, wherein, as shown in FIG. 8, the method may include:

S801, in a first refresh rate stage, providing, by a latch module, a control signal of the masking signal end to the selection output module according to the signals of the cascade signal output end and the reverse signal output end of the previous level; providing, by the selection output module, a signal of the first power supply end to the driving signal output end in response to the control signal of the masking signal end; for example, in a first refresh rate stage, providing a low-level control signal of a masking signal end by a latch module to a selection output module according to signals of the cascade signal output end of the present level and a reverse signal output end of the previous level; providing a high-level signal of the first power supply end by the selection output module to the driving signal output end in response to a low level control signal of the masking signal end;

S802, in a second refresh rate stage, providing, by the latch module, a control signal of the masking signal end to the selection output module according to the signals of the cascade signal output end and the reverse signal output end of the previous level; and providing, by the selection output module, a signal of the second power supply end to the driving signal output end in response to the control signal of the masking signal end.

For example, in a second refresh rate stage, the latch module provides a high-level control signal of the masking signal end to the selection output module according to the signals of the cascade signal output end of the present level and the reverse signal output end of the previous level. The selection output module provides a low-level signal of the first power supply end to the driving signal output end in response to a high level control signal of the masking signal end.

In particular, the first refresh rate stage corresponds to a high refresh rate stage in the aforementioned one of the shift registers, and the second refresh rate stage corresponds to a low refresh rate stage in the aforementioned one of the shift registers.

Here, the driving principle and the specific embodiment of the driving method are the same as those of the shift register of the above-mentioned embodiment. Therefore, the driving method may be implemented with reference to the specific embodiment of the shift register of the above-mentioned embodiment, which will not be described in detail herein.

Figure 9:
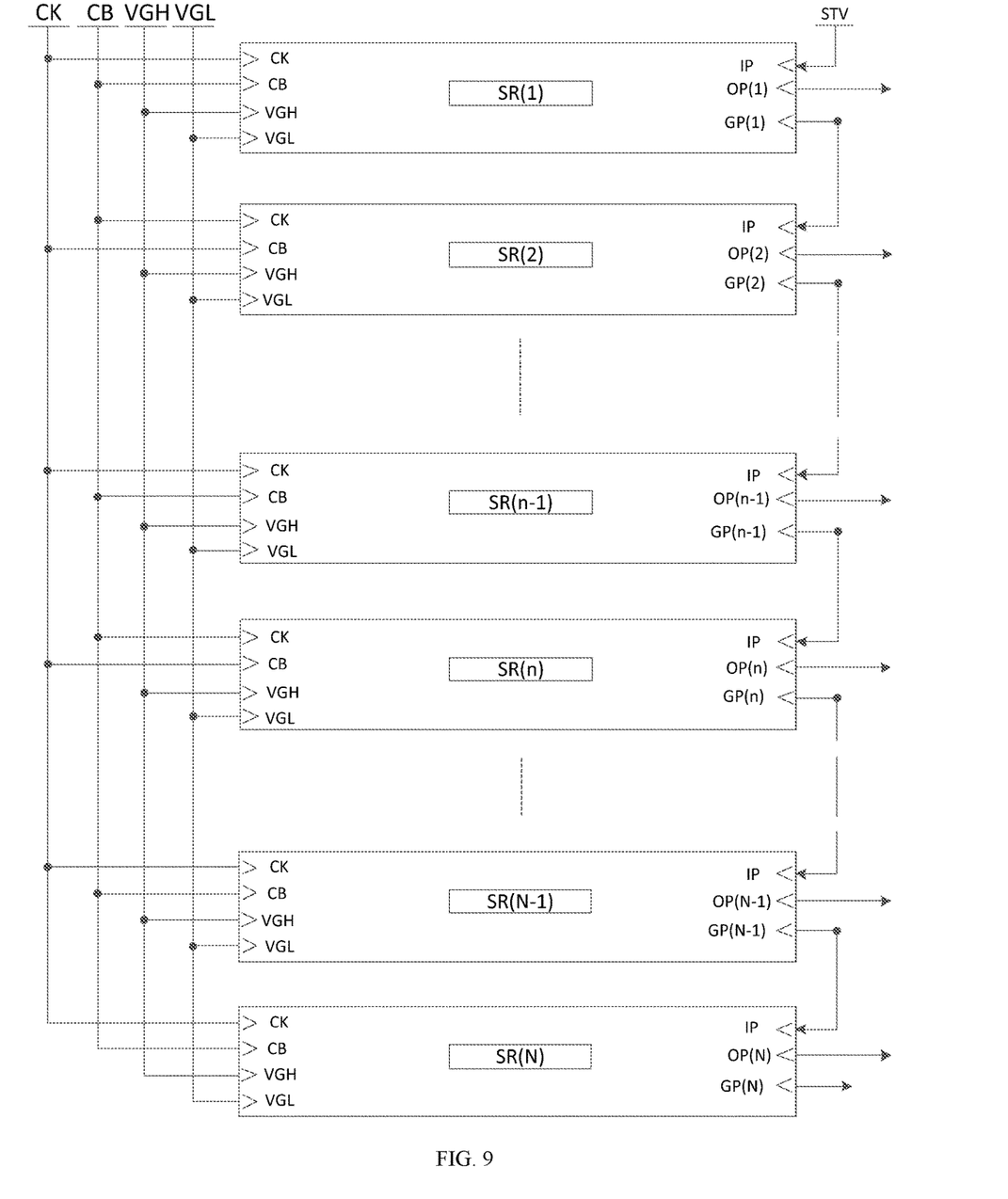
FIG. 9 is a schematic structural diagram of a gate drive circuit according to an embodiment of the present disclosure.

Based on the same inventive concept, the embodiments of the present disclosure also provide a gate drive circuit, as shown in FIG. 9, including a plurality of the above-mentioned shift registers SR(1), SR(2), . . . , SR(n−1), SR(n), . . . , SR(N−1) and SR(N) provided by the embodiments of the present disclosure in cascade (a total of N shift registers, 1≤n≤N, n being an integer). Herein, the input signal end IP of the first-stage shift register SR(1) is configured for being coupled to a frame trigger signal end STV.

In each adjacent two shift registers, an input signal end of a shift register SR(n) of a next level is configured for being coupled to a cascade signal output end GP(n) of a shift register SR(n−1) of the previous level.

Specifically, the specific structure of each shift register in the above-mentioned gate drive circuit is the same in function and structure as the above-mentioned shift register of the present disclosure, and the repetition will not be repeated. The gate drive circuit may be configured in a liquid crystal display panel, or may be configured in an electroluminescent display panel, without being limited thereto.

Based on the same inventive concept, the embodiments of the present disclosure also provide a display device including the above-mentioned gate drive circuit provided by the embodiments of the present disclosure. The principle of the display device for solving the problem is similar to that of the shift register described above. Therefore, the implementation of the display device may be seen with reference to the implementation of the shift register described above, and the repetition will not be repeated here.

Figure 10:
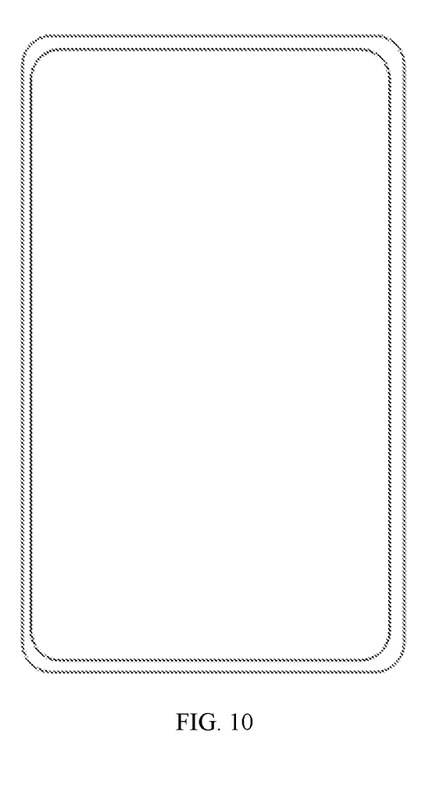
FIG. 10 is a schematic structural diagram of a display device according to an embodiment of the present disclosure.

In a specific implementation, the display device provided by the embodiments of the present disclosure may be a cell phone as shown in FIG. 10. Of course, the above-mentioned display device provided by the embodiments of the present disclosure may also be any product or component having a display function such as a tablet computer, a television, a display, a notebook computer, a digital photo frame, a navigator, etc. Other essential components of the display device will be understood by those of ordinary skill in the art. They are not described in detail herein and should not serve to limit the present disclosure.

In the specific implementation, the above-mentioned display device provided by the embodiments of the present disclosure may be a liquid crystal display device or an organic light emitting display device.

Although the preferred embodiments of the present disclosure have been described, persons skilled in the art may make additional changes and modifications to these embodiments once they have knowledge of the basic creative concepts. Therefore, the attached claims are intended to be interpreted as including preferred embodiments and all changes and modifications falling within the scope of the present disclosure.

Obviously, technical personnel in the art can make various modifications and variations to the embodiments of the present disclosure without departing from the spirit and scope of the embodiments of the present disclosure. In this way, if these modifications and variations of the embodiments of the present disclosure fall within the scope of the claims of the present disclosure and their equivalent technologies, the present disclosure also intends to include these modifications and variations.

The invention claimed is:

1. A shift register, comprising:
    a shift module respectively coupled to an input signal end and a cascade signal output end, wherein the shift module is configured for causing the cascade signal output end to output a cascade signal in response to a signal of the input signal end;
    a reverse output module respectively coupled to the cascade signal output end, a first power supply end, a second power supply end and a reverse signal output end, wherein the reverse output module is configured for causing the reverse signal output end to output a signal reverse to the cascade signal output end in response to a signal of the cascade signal output end;
    a latch module respectively coupled to a masking signal end, the cascade signal output end and the reverse signal output end of a previous level, wherein the latch module is configured for causing an output end of the latch module to output a control signal of the masking signal end in response to signals of the cascade signal output end and the reverse signal output end of the previous level; and
    a selection output module respectively coupled to the first power supply end, the second power supply end, the output end of the latch module and a driving signal output end, wherein the selection output module is configured for providing a signal of the first power supply end or a signal of the second power supply end to the driving signal output end in response to a signal of the output end of the latch module.

2. The shift register according to claim 1, wherein the reverse output module comprises a first switching transistor and a second switching transistor; the types of the first switching transistor and the second switching transistor are different;

wherein, a gate of the first switching transistor is coupled to the cascade signal output end, a first electrode of the first switching transistor is coupled to the first power supply end, and a second electrode of the first switching transistor is coupled to the reverse signal output end; and a gate of the second switching transistor is coupled to the cascade signal output end, a first electrode of the second switching transistor is coupled to the second power supply end, and a second electrode of the second switching transistor is coupled to the reverse signal output end.

3. The shift register according to claim 2, wherein the latch module comprises a third switching transistor and a fourth switching transistor;

wherein, a gate of the third switching transistor is coupled to the cascade signal output end, a first electrode of the third switching transistor is coupled to the masking signal end, and a second electrode of the third switching transistor is coupled to a first electrode of the fourth switching transistor; and a gate of the fourth switching transistor is coupled to the reverse signal output end of the previous level, and a second electrode of the fourth switching transistor is the output end of the latch module.

4. The shift register according to claim 3, wherein the selection output module comprises a fifth switching transistor, a sixth switching transistor and a first capacitor; the types of the fifth switching transistor and the sixth switching transistor are different;

wherein, a gate of the fifth switching transistor is coupled to the second electrode of the fourth switching transistor, and a first electrode of the fifth switching transistor is coupled to the driving signal output end;

a gate of the sixth switching transistor is coupled to the second electrode of the fourth switching transistor, a first electrode of the sixth switching transistor is coupled to the second power supply end, and a second electrode of the sixth switching transistor is coupled to the driving signal output end; and a first end of the first capacitor is coupled to the first power supply end, and a second end of the first capacitor is coupled to the second electrode of the fourth switching transistor.

5. The shift register according to claim 4, wherein a second electrode of the fifth switching transistor is coupled to the cascade signal output end.

6. The shift register according to claim 5, further comprising an eighth switching transistor, wherein a gate of the eighth switching transistor is coupled to the shift module, a first electrode of the eighth switching transistor is coupled to the second power supply end, and a second electrode of the eighth switching transistor is coupled to the driving signal output end.

7. The shift register according to claim 6, wherein the first switching transistor, the third switching transistor, the fourth switching transistor, the fifth switching transistor, and the eighth switching transistor are P-type transistors; and the second switching transistor and the sixth switching transistor are both N-type transistors.

8. The shift register according to claim 6, wherein the shift module comprises:

an input circuit respectively coupled to the input signal end, a first clock signal end, the second power supply end, a first node and a second node, wherein the input circuit is configured for providing the signal of the input signal end to the first node and the second node in response to a signal of the first clock signal end;

a node control circuit respectively coupled to the first node, the second node, a third node, a fourth node, a fifth node, the first power supply end, the second power supply end, the first clock signal end and the second clock signal end, wherein the node control circuit is configured for adjusting signals at the first node, the second node, the third node, the fourth node and the fifth node, so that the cascade signal output end outputs the signal of the first power supply end or the signal of the second power supply end;

a reset circuit respectively coupled to the first power supply end, a reset signal end, the first node, the fourth node and the fifth node, wherein the reset circuit is configured for resetting a cascade signal output by the cascade signal output end in response to a signal of the reset signal end;

a first cascade output circuit respectively coupled to the fourth node, the first power supply end and the cascade signal output end, wherein the first cascade output circuit is configured for providing the signal of the first power supply end to the cascade signal output end in response to a signal of the fourth node; the gate of the seventh switching transistor is coupled to the fourth node; and a second cascade output circuit respectively coupled to the fifth node, the second power supply end and the cascade signal output end, wherein the second cascade output circuit is configured for providing the signal of the second power supply end to the cascade signal output end in response to a signal of the fifth node; and the gate of the eighth switching transistor is coupled to the fifth node.

9. The shift register according to claim 8, wherein the input circuit comprises a ninth switching transistor, a tenth switching transistor and an eleventh switching transistor;

a gate of the ninth switching transistor is coupled to the first clock signal end, a first electrode of the ninth switching transistor is coupled to the input signal end, and a second electrode of the ninth switching transistor is coupled to the first node;

a gate of the tenth switching transistor is coupled to the first clock signal end, a first electrode of the tenth switching transistor is coupled to the input signal end, and a second electrode of the tenth switching transistor is coupled to a first electrode of the eleventh switching transistor;

a gate of the eleventh switching transistor is coupled to the second power supply end, and a second electrode of the eleventh switching transistor is coupled to the second node.

10. The shift register according to claim 8, wherein the node control circuit comprises a twelfth switching transistor, a thirteenth switching transistor, a fourteenth switching transistor, a fifteenth switching transistor, a sixteenth switching transistor, a seventeenth switching transistor, an eighteenth switching transistor, a nineteenth switching transistor, a second capacitor and a third capacitor;

wherein, a gate of the twelfth switching transistor is coupled to the first clock signal end, a first electrode of the twelfth switching transistor is coupled to the second power supply end, and a second electrode of the twelfth switching transistor is coupled to the third node;

a gate of the thirteenth switching transistor is coupled to the first node, a first electrode of the thirteenth switching transistor is coupled to the first clock signal end, and a second electrode of the thirteenth switching transistor is coupled to the third node;

a gate and a first electrode of the fourteenth switching transistor are both coupled to the second node, and a second electrode of the fourteenth switching transistor is coupled to the fifth node;

a gate of the fifteenth switching transistor is coupled to the second node, a first electrode of the fifteenth switching transistor is coupled to the second clock signal end, and a second electrode of the fifteenth switching transistor is coupled to a first electrode of the sixteenth switching transistor;

a gate of the sixteenth switching transistor is coupled to the third node, and a second electrode of the sixteenth switching transistor is coupled to the first power supply end;

a first end of the second capacitor is coupled to the second node, and a second end of the second capacitor is coupled to the first electrode of the sixteenth switching transistor;

a gate of the seventeenth switching transistor is coupled to the second power supply end, a first electrode of the seventeenth switching transistor is coupled to the third node, and a second electrode of the seventeenth switching transistor is coupled to a gate of the eighteenth switching transistor;

a first electrode of the eighteenth switching transistor is coupled to the second clock signal end, and a second electrode of the eighteenth switching transistor is coupled to a first electrode of the nineteenth switching transistor;

a gate of the nineteenth switching transistor is coupled to the second clock signal end, and a second electrode of the nineteenth switching transistor is coupled to the fourth node; and a first end of the third capacitor is coupled to the gate of the eighteenth switching transistor, and a second end of the third capacitor is coupled to the second electrode of the eighteenth switching transistor.

11. The shift register according to claim 8, wherein the reset circuit comprises a twentieth switching transistor, a twenty-first switching transistor and a twenty-second switching transistor;

wherein, a gate of the twentieth switching transistor is coupled to the reset signal end, a first electrode of the twentieth switching transistor is coupled to the first power supply end, and a second electrode of the twentieth switching transistor is coupled to the first node and a gate of the twenty-first switching transistor;

a first electrode of the twenty-first switching transistor is coupled to the first power supply end, and a second electrode of the twenty-first switching transistor is coupled to the fourth node; and a gate of the twenty-second switching transistor is coupled to the second power supply end, a first electrode of the twenty-second switching transistor is coupled to the first node, and a second electrode of the twenty-second switching transistor is coupled to the fifth node.

12. The shift register according to claim 8, wherein the first cascade output circuit comprises a twenty-third switching transistor and a fourth capacitor;

wherein, a gate of the twenty-third switching transistor is coupled to the fourth node, a first electrode of the twenty-third switching transistor is coupled to the first power supply end, a second electrode of the twenty-third switching transistor is coupled to the cascade signal output end; and a first end of the fourth capacitor is coupled to the fourth node, and a second end of the fourth capacitor is coupled to the first power supply end.

13. The shift register according to claim 8, wherein the second cascade output circuit comprises a twenty-fourth switching transistor, a gate of the twenty-fourth switching transistor is coupled to the fifth node, a first electrode of the twenty-fourth switching transistor is coupled to the second power supply end, and a second electrode of the twenty-fourth switching transistor is coupled to the cascade signal output end.

14. The shift register according to claim 4, wherein the selection output module further comprises a seventh switching transistor; the type of the seventh switching transistor is the same as the type of the fifth switching transistor; a gate of the seventh switching transistor is coupled to the shift module, a first electrode of the seventh switching transistor is coupled to the first power supply end, and a second electrode of the seventh switching transistor is coupled to a second electrode of the fifth switching transistor.

15. A gate drive circuit, wherein the gate drive circuit comprises a plurality of cascaded shift registers according to claim 1;

an input signal end of a first-stage shift register is configured for being coupled to a frame trigger signal end; and in each adjacent two of the shift registers, an input signal end of a shift register of a next level is configured for being coupled to a cascade signal output end of a shift register of a previous level.

16. A display device, wherein the display device comprises the gate drive circuit according to claim 15.

17. A method for driving the shift register according to claim 1, wherein the method comprises:

in a first refresh rate stage, providing, by the latch module, a control signal of the masking signal end to the selection output module according to the signals of the cascade signal output end and the reverse signal output end of the previous level; and providing, by the selection output module, the signal of the first power supply end to the driving signal output end in response to the control signal of the masking signal end; and in a second refresh rate stage, providing, by the latch module, a control signal of the masking signal end to the selection output module according to the signals of the cascade signal output end and the reverse signal output end of the previous level; and providing, by the selection output module, the signal of the second power supply end to the driving signal output end in response to the control signal of the masking signal end.

* * * * *